United States Patent [19]

Inoue et al.

[11] Patent Number: 4,882,300

[45] Date of Patent: Nov. 21, 1989

[54] METHOD OF FORMING SINGLE CRYSTALLINE MAGNESIA SPINEL FILM

[75] Inventors: Yasunori Inoue, Osaka; Hiroshi Hanafusa, Hirakata, both of Japan

[73] Assignee: Agency of Industrial Science and Technology, Tokyo, Japan

[21] Appl. No.: 254,430

[22] Filed: Oct. 6, 1988

[30] Foreign Application Priority Data

Oct. 12, 1987 [JP] Japan ................................ 62-254615

[51] Int. Cl.[4] .............................................. H01L 21/31

[52] U.S. Cl. ........................... 437/236; 148/DIG. 41; 148/DIG. 118; 148/DIG. 150; 156/613; 427/252; 437/235; 437/971

[58] Field of Search ................... 148/DIG. 22, 41, 97, 148/118, 150; 156/610–615; 427/126.6, 252, 255, 250; 501/118–120, 153, 69; 437/81, 84, 235, 236, 449, 971

[56] References Cited

U.S. PATENT DOCUMENTS

| | | | |
|---|---|---|---|
| 3,864,165 | 2/1975 | Braginski | 427/126.6 |
| 3,926,838 | 12/1975 | Reade | 501/69 |
| 3,990,902 | 11/1976 | Nishizawa et al. | 501/134 |
| 4,604,118 | 8/1986 | Bocko et al. | 427/252 |
| 4,640,903 | 2/1987 | Matsuhiro et al. | 501/97 |
| 4,664,473 | 5/1987 | Gannon | 501/37 |
| 4,794,048 | 12/1988 | Oboodi et al. | 501/62 |

OTHER PUBLICATIONS

Archer et al., "Growth Habit in Single Crystal Films Grown Over Wires", J. Crys. Growth, vol. 3/4, 1968, pp. 227–230.

*Primary Examiner*—Brian E. Hearn
*Assistant Examiner*—William Bunch
*Attorney, Agent, or Firm*—Darby & Darby

[57] ABSTRACT

The present invention relates to a method of forming a single crystalline magnesia spinel film on a single crystalline silicon substrate by the use of the vapor-phase epitaxial method.

According to the method of the present invention, at first a first single crystalline magnesia spinel layer having a compositional ratio of magnesium maintained at a nearly stoichiometric compositional ratio is epitaxially grown in a vapor-phase on the single crystalline silicon substrate, and then a second single crystalline magnesia spinel layer having a compositional ratio of magnesium which decreases upward is epitaxially grown in a vapor-phase on the first single crystalline magnesia spinel layer. In the event that a Si film is grown on the single crystalline magnesia spinel film formed by the method of the present invention, out of atoms of Mg and Al taken in the Si film in the initial growth stage of the Si film, a concentration of Mg atoms which react more actively upon Si can be reduced. As a result, a reaction between Si and Mg can be suppressed to prevent the Si film from deteriorating its quality, whereby a SOI film having superior quality can be obtained.

10 Claims, 2 Drawing Sheets

COMPOSITIONAL RATIO OF Mg [X] →
40
30
20
10
0
FIRST SINGLE CRYSTALLINE MAGNESIA SPINEL LAYER 16
SECOND SINGLE CRYSTALLINE MAGNESIA SPINEL LAYER 17
500 1000 1500 2000 2500
FILM THICKNESS OF THE SINGLE CRYSTALLINE MAGNESIA SPINEL FILM FROM A SURFACE OF A SI SUBSTRATE [Å]

METHOD OF FORMING SINGLE CRYSTALLINE MAGNESIA SPINEL FILM

BACKGROUND OF THE INVENTION

1. Field of the Invention

The present invention relates to a method of forming a single crystalline magnesia spinel film in which a single crystalline magnesia spinel film is formed on a single crystalline silicon substrate by a vapor-phase epitaxial growth method.

2. Description of the Prior Art

In general, a SOI [silicon on insulator] film obtained by forming a single crystalline insulating film, such as a single crystalline magnesia spinel film, on a single crystalline silicon substrate and further forming a single crystalline silicon film on the single crystalline insulating film is watched with interest as an element material for giving a high integration degree to an integrated circuit, making the higher operation speed and reducing an electric power consumption.

By the way, magnesia spinel is expressed by a chemical formula of $MgO.Al_2O_3$ and then a compositional ratio R of magnesium [Mg] is expressed as $R=33.3\%$ [$=Mg/(Mg+Al)\%$] in the case where oxygen [O] is not taken into consideration, and magnesia spinel, in which the compositional ratio R of Mg is a stoichiometric compositional ratio as described above, shows the smallest difference from silicon [Si] in a lattice constant and is superior in the thermal stability, so that it has been applied to the single crystalline insulating film in the SOI.

For, an example of an art of the SOI using the single crystalline magnesia spinel film having a nearly stoichiometric compositional ratio, there has been disclosed "a growth technique of a $Si/MgO.Al_2O_3/Si$ structure" on page 21 to 26, ED 86-65, Bulletin of Japanese Society of Electronic Correspondence (Ihara). According to this report, a $MgO.\ Al_2O_3$ film having a stoichiometric compositional ratio and a thickness of about 4,000 Å is epitaxially grown on a Si substrate and subjected to a heat treatment at 1,200° C. in an atmosphere of wet $N_2$ gas to oxidize an interface between the Si substrate and the $MgO.\ Al_2O_3$ film, whereby forming a $SiO_2$ layer, and then a single crystalline Si film having a thickness of about 3,000 Å is epitaxially grown on the $MgO.\ Al_2O_3$ film to dope the single crystalline Si film at a carrier concentration $n=1\times10^{17}cm^{-3}$, whereby an electron hole mobility amounts to 500 $cm^2V.sec$.

In addition, it has been reported that a drain leak current $I_D$ amounts to $10^{-11}A$/micron when n-MOSFET was formed on the single crystalline Si film with a ring type pattern having $W/L=1130/10$ microns.

However, in the case of the SOI film using $MgO.Al_2O_3$ with the stoichiometric compositional ratio, as described in the literature, the drain leak current of MOSFET is dependent upon a concentration of atoms of Mg and Al taken in the Si film by the reaction of Si upon $MgO.Al_2O_3$ in the initial growth stage of the single crystalline Si film, which is an upper layer, so that a sufficiently low value of drain leak current can not be obtained. Also the electron hole mobility is inferior to the case of the SOI film produced by the laser recrystallization method. Accordingly, the conventional SOI film obtained by epitaxially growing a single crystalline $MgO.Al_2O_3$ film maintaining a nearly stoichiometric compositional ratio on a single crystalline Si substrate and epitaxially growing a single crystalline Si film on the upper layer has a problem that the characteristics of the resulting device can not be highly improved.

SUMMARY OF THE INVENTION

The present invention has been achieved in order to solve the above described problem. For a method of forming a single crystalline magnesia spinel film of the present invention, a first single crystalline magnesia spinel layer containing Mg at nearly stoichiometric compositional ratio is epitaxially grown on a single crystalline silicon substrate in a vapor-phase and then a second single crystalline magnesia spinel layer containing Mg at ratios which decrease upward is epitaxially grown in a vapor-phase on the resulting first single crystalline magnesia spinel layer.

Accordingly, it is a first object of the present invention to provide a method capable of forming, on a single crystalline Si substrate, a single crystalline magnesia spinel film wherein a concentration of Mg atoms which react more actively upon Si out of atoms of Mg and Al taken in the Si film at the first growth stage of the Si film, which is an upper layer, is greatly reduced in comparison with the conventional method.

It is a second object of the present invention to provide a method of forming, on a single crystalline Si substrate, a single crystalline magnesia spinel film wherein a reaction of Si upon Mg is suppressed and whereby the Si film, which is an upper layer, is prevented from deteriorating its quality.

It is a third object of the present invention to provide a method of forming a single crystalline magnesia spinel film capable of obtaining a SOI film of superior quality and improving characteristics of various kinds of devices.

The above and further objects and features of the invention will more fully be apparent from the following detailed description with accompanying drawings.

DESCRIPTION OF THE PREFERRED EMBODIMENTS

The preferred embodiments of the present invention will be concretely described below.

Figure 2:
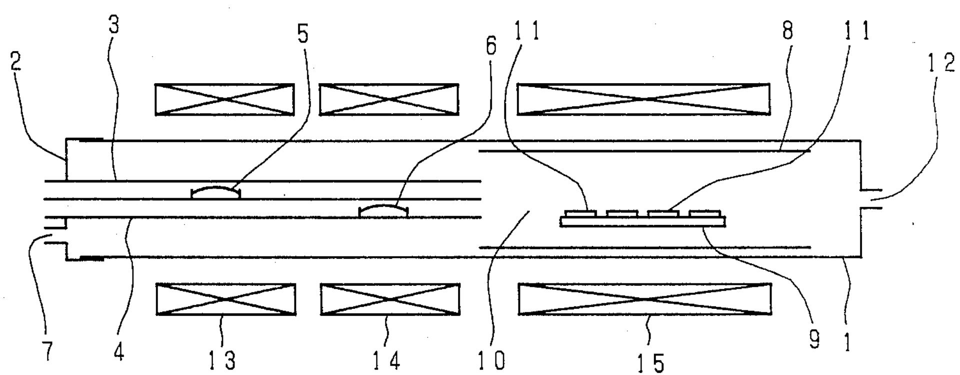
FIG. 2 is a front view roughly showing an apparatus for carrying out a method according to the present invention.

At first, referring to FIG. 2 showing a CVD apparatus used in the method according to the present invention, reference numeral 1 designates a quartz reaction tube. An opening on a left side of the quartz reaction tube 1 is closed up tightly by means of a quartz cap 2, the quartz cap 2 being provided with a first source tube 3 and a second source tube 4 passing therethrough, right ends of the first source tube 3 and the second source tube 4 being extended up to a central portion of the quartz reaction tube 1, and the first source tube 3 and the second source tube 4 being supplied with a $(HCl+H_2)$ gas and a $H_2$ gas, respectively. In addition, an Al source 5 is disposed at an almost central portion in the first source tube 3 and a $MgCl_2$ source 6 is disposed at a right end the second source tube 4.

The quartz cap 2 is provided with a supply port 7 communicating with the quartz reaction tube 1 for supplying the inside of the tube 1 with a $(CO_2+H_2)$ gas. A quartz liner tube 8 is disposed at a right end in the quartz reaction tube 1 and a susceptor 9 for holding a plurality of single crystalline Si substrate 11 is disposed in a reaction chamber 10 on the inner side of the liner tube 8. An exhaust port 12 communicating with the quartz reaction tube 1 is formed on the right side of the quartz reaction tube 1. In addition, resistance heating furnaces 13, 14, and 15 are disposed on the outer side of the left end portion, central portion and right end portion of the quartz reaction tube 1, respectively, to heat the Al source 5, the $MgCl_2$ source 6 and the Si substrate 11 each to different temperatures.

The growth reaction of the single crystalline magnesia spinel film in the case where the CVD apparatus is used will be described below. Al being evaporated by heating the Al source 5 acts upon the $(HCl+H_2)$ gas in accordance with the following reaction:

$$Al+3HCl\rightarrow AlCl_3+(3/2)H_2$$

So, the resulting $AlCl_3$ is transferred into the reaction chamber 10. $MgCl_2$ being evaporated by heating the $MgCl_2$ source 6 is transferred into the reaction chamber 10 by the $H_2$ gas. According to a reaction expressed as

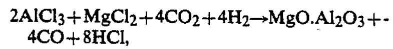

$$2AlCl_3+MgCl_2+4CO_2+4H_2\rightarrow MgO.Al_2O_3+4CO+8HCl,$$

the $AlCl_3$ gas, the $MgCl_2$ gas and the $(CO_2+H_2)$ gas supplied through the supply port 7 react on the Si substrate 11 to accumulate $MgO.Al_2O_3$ on the Si substrate 11, whereby the single crystalline magnesia spinel film is epitaxially grown.

Next, the process of forming the single crystalline magnesia spinel film will be described below with reference to FIG. 1.

Figure 1:
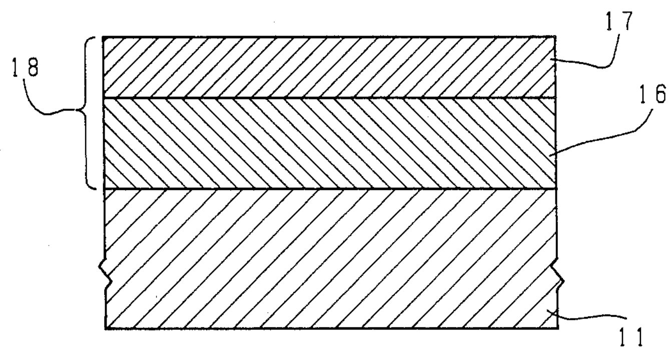
FIG. 1 is a sectional view showing a single crystalline magnesia spinel film formed by a method according to the present invention.

As shown in FIG. 1, the p-type single crystalline Si (100) substrate 11 having a specific resistance of 10 to 15 ohm cm is set on the susceptor 9. The Al source 5, the $MgCl_2$ source 6 and the Si substrate 11 are heated up to 650° C., 850° C. and 950° C., respectively, by means of the respective heating furnaces 13 to 15. As to a flow rate of the $(HCl+H_2)$ gas supplied into the first source tube 3, the flow rate of HCl is set at 15 cc/min and the flow rate of $H_2$ is set at 2 liters/min. The flow rate of the $H_2$ gas supplied into the second source tube 4 is set at 3 liters/min. As to a flow rate of the $(CO_2+H_2)$ gas supplied through the supply port 7, the flow rate of $CO_2$ is set at 70 cc/min and the flow rate of $H_2$ is set at 7 liters/min. The reaction is continued for 15 minutes under such conditions to epitaxially grow a first single crystalline magnesia spinel layer 16 having a compositional ratio of Mg maintained at a nearly stichiometric compositional ratio $R=33.3\%$ and a thickness of about 1,500 Å on the Si substrate 11.

Subsequently, the reaction is continued for 10 minutes under the conditions with reducing the temperature of the $MgCl_2$ source 6 by the heating furnace 14 at a rate of about 10° C./min to epitaxially grow a second single crystalline magnesia spinel layer 17 having a compositional ratio R of Mg gradually reduced upward from the stoichiometric compositional ratio $R=33.3\%$ and a thickness of about 1,000 Å on the first single crystalline magnesia spinel layer 16, whereby forming a single crystalline magnesia spinel film comprising the magnesia spinel layer 16 and the magnesia spinel layer 17 both on the Si substrate 11.

Figure 3:
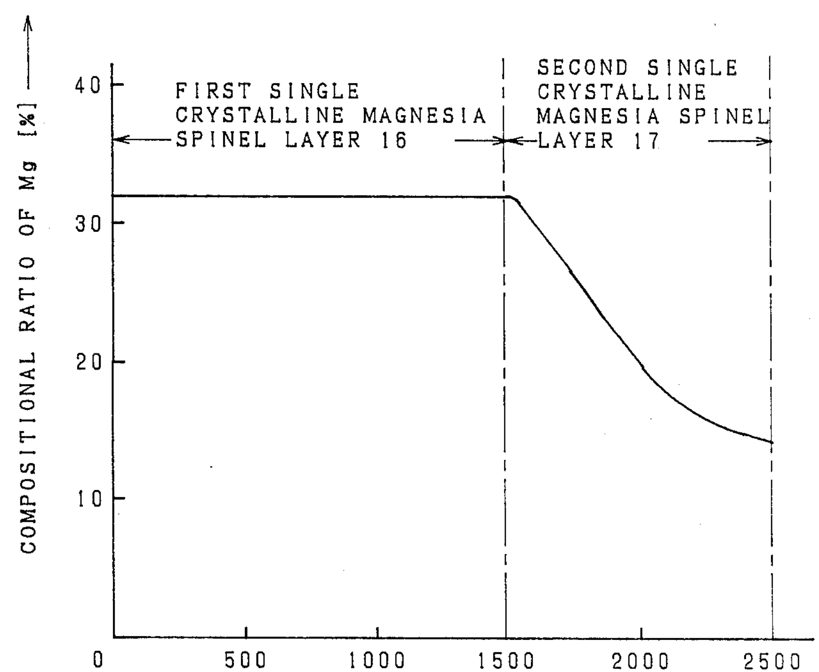
FIG. 3 is a graph showing a relation between a compositional ratio of Mg and a thickness of the single crystalline magnesia spinel film formed by a method according to the present invention.

From the results of an analysis of the compositional ratio of Mg in the upward direction, that is, the growth direction of the single crystalline magnesia spinel film 18 formed in the process, by the XPS [X-ray Photoelectron Spectroscopy] method as shown in FIG. 3, it is found that the compositional ratio of Mg is maintained at the nearly stoichiometric compositional ratio (=33.3%) in the first single crystalline magnesia spinel layer 16 having a thickness up to about 1,500 Å from the surface of the Si substrate 11. It is also found that the compositional ratio of Mg is gradually reduced as the film thickness is increased in the second single crystalline magnesia spinel layer 17 ranging from about 1,500 to about 2,500 Å from the surface of the Si substrate 11.

By the way, in order to produce a SOI film by using such single crystalline magnesia spinel film 18, the single crystalline magnesia spinel film 18 was formed on the Si substrate 11 and then an interface between the formed single crystalline magnesia spinel film 18 and the Si substrate 11 was oxidized at a temperature of 1,200° C. in an atmosphere of a wet $N_2$ gas to form a $SiO_2$ layer. And after forming a single crystalline Si film having a thickness of about 3,000 Å on the spinel film 18 by the molecular beam epitaxial method, phosphorus [P] was doped in the Si film at a carrier concentration of $1\times10^{17}cm^{-3}$. As the result of an investigation for the electrical characteristics of the obtained single crystalline Si film, it was shown that the electron hole mobility amounted to 600 $cm^2/V\cdot sec$ and that the drain leak current $I_D$ at the time when n-MOSFET was produced held $I_D<10^{-11}$ A/micron. So that both values are superior to the characteristic values of the SOI film described in the literature and thus the SOI film of superior quality can be obtained.

The compositional ratio of Mg in the second single crystalline magnesia spinel layer 17 below the single crystalline Si film, which is the upper layer, is reduced as it approaches to the Si film, which is the upper layer, so that out of atoms of Mg and Al taken in the Si film in the initial growth stage of the Si film, which is the upper layer, the concentration of Mg atoms which react more actively upon Si is greatly reduced in comparison with the conventional method. As a result, the reaction between Si and Mg is suppressed to prevent the Si film, which is the upper layer, from deteriorating its quality and the SOI film of superior quality is obtained. Thus, it is possible to have desire to improve the characteristics of devices greatly.

In the embodiment, so as to reduce the compositional ratio of Mg in the second single crystalline magnesia spinel layer 17 gradually, the temperature in the heating furnace 14 is lowered at a constant rate. However, the similar effect can be obtained by reducing the flow rate of the $CO_2$ gas gradually or reducing the flow rate of $H_2$ gas supplied into the second source tube 4 gradually.

As described above, according to the method of forming the single crystalline magnesia spinel film of the present invention, the second single crystalline magnesia spinel layer having the compositional ratio of Mg being reduced upward gradually from the stoichiometric ratio is grown on the first single crystalline magnesia spinel layer having the compositional ratio of magnesium [Mg] being maintained at nearly the stoichiometric ratio. And the single crystalline magnesia spinel film is formed from both magnesia spinel layers, so that in the case where the SOI film is produced by growing the single crystalline Si film epitaxially on this single crystalline magnesia spinel film, out of the atoms of Mg and Al taken in the Si film, in the initial growth stage of the Si film, which is the upper layer, the concentration of Mg atoms which react more actively upon Si can be greatly reduced in comparison with the conventional method. As a result, the reaction between Si and Mg can be suppressed to prevent the Si film, which is the upper layer, from deteriorating its quality, whereby the characteristics of devices can be extremely improved. Its effect is remarkably great and the present invention can be extremely effective for the SOI technique.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds thereof are therefore intended to be embraced by the claims.

What is claimed is:

1. A method of forming a single crystalline magnesia spinel film on a single crystalline silicon substrate by the vapor-phase epitaxial growth method comprising;

epitaxially growing in a vapor-phase a first single crystalline magnesia spinel layer having a compositional ratio of magnesium being maintained at a nearly stoichiometric ratio on said single crystalline silicon substrate; and epitaxially growing in a vapor-phase a second single crystalline magnesia spinel layer having a compositional ratio of magnesium which decreases from the stoichiometric compositional ratio according as being apart from said first single crystalline magnesia spinel layer on said first single crystalline magnesia spinel layer, and said single crystalline magnesia spinel film is made of said first single crystalline magnesia spinel layer and said second single crystalline magnesia spinel layer.

2. A method of forming a single crystalline magnesia spinel film as set forth in claim 1, wherein the compositional ratio of magnesium of said second single crystalline magnesia spinel layer decreases continuously according as being apart from said first single crystalline magnesia spinel layer.

3. A method of forming a single crystalline magnesia spinel film as set forth in claim 1 wherein growing said first and second single crystalline magnesia spinel layers is carried out in a quartz reaction tube.

4. A method of forming a single crystalline magnesia spinel film as set forth in claim 3 wherein a $(HCl+H_2)$ gas is supplied in said quartz reaction tube through a first source tube provided with an Al source therein, a $H_2$ gas is supplied in said quartz reaction tube through a second source tube provided with a $MgCl_2$ source therein, and a $CO_2$ gas is supplied in said quartz reaction tube.

5. A method of forming a single crystalline magnesia spinel film as set forth in claim 4 wherein a temperature of said $MgCl_2$ source is gradually lowered in growing said second single crystalline magnesia spinel layer.

6. A method of forming a single crystalline magnesia spinel film as set forth in claim 5 wherein a temperature of said $MgCl_2$ source in growing said first single crystalline magnesia spinel layer is set at 850° C. and the temperature of said $MgCl_2$ source in growing said second single crystalline magnesia spinel layer is gradually lowered at a rate of 10° C./min from 850° C.

7. A method of forming a single crystalline magnesia spinel film as set forth in claim 4 wherein a flow rate of said $CO_2$ gas to be supplied in said quartz reaction tube is gradually reduced in growing said second single crystalline magnesia spinel layer.

8. A method of forming a single crystalline magnesia spinel film as set forth in claim 4 wherein a flow rate of said $H_2$ gas to be supplied in said quartz reaction tube through said second source tube is gradually reduced in growing said second single crystalline magnesia spinel layer.

9. A method of forming a single crystalline magnesia spinel film as set forth in claim 1 wherein a grown film thickness of said first single crystalline magnesia spinel layer is set at about 1,500 Å and a grown film thickness of said second single crystalline magnesia spinel layer is set at about 1,000 Å.

10. A method of forming a single crystalline magnesia spinel film as set forth in claim 1 wherein said second single crystalline magnesia spinel layer is grown so that the compositional ratio of magnesium in the uppermost surface thereof may amount to about a half of the stoichiometric compositional ratio.

* * * * *